United States Patent
Chen et al.

(10) Patent No.: US 9,502,621 B2
(45) Date of Patent: Nov. 22, 2016

(54) HIGH ENERGY INVISIBLE LIGHT LIGHT EMITTING DIODE HAVING SAFETY INDICATION

(71) Applicant: HIGH POWER OPTO. INC., Taichung (TW)

(72) Inventors: Fu-Bang Chen, Taichung (TW); Shih-Hsien Huang, Taichung (TW); Wei-Yu Yen, Taichung (TW); Yen-Chin Wang, Taichung (TW); Kuo-Hsin Huang, Taichung (TW)

(73) Assignee: HIGH POWER OPTO, INC., Taichung (TW)

( * ) Notice: Subject to any disclaimer, the term of this patent is extended or adjusted under 35 U.S.C. 154(b) by 0 days.

(21) Appl. No.: 14/665,959

(22) Filed: Mar. 23, 2015

(65) Prior Publication Data
US 2016/0284945 A1    Sep. 29, 2016

(51) Int. Cl.
*H01L 33/50* (2010.01)

(52) U.S. Cl.
CPC ............. *H01L 33/50* (2013.01); *H01L 33/505* (2013.01)

(58) Field of Classification Search
CPC ........... H01L 33/00–33/648; A45D 2200/205; G09F 13/42; G01J 1/429; G01N 21/33; G01N 2021/335; A23L 3/28; A61L 2/10; A61L 9/20; A61N 2005/0661; A61N 2005/0615; C02F 1/32; C02F 1/325; F24F 2003/1667
See application file for complete search history.

(56) References Cited

U.S. PATENT DOCUMENTS

| | | | |
|---|---|---|---|
| 5,382,799 A * | 1/1995 | May | G01J 1/02 250/372 |
| 7,223,998 B2 | 5/2007 | Schwach et al. | |
| 7,285,791 B2 * | 10/2007 | Beeson | H05B 33/10 250/483.1 |
| 7,479,641 B2 * | 1/2009 | Wong | G01J 1/429 250/372 |
| 7,581,342 B2 * | 9/2009 | Egami | G09F 19/12 340/815.44 |
| 7,582,840 B2 * | 9/2009 | Lerenius | G06F 3/0202 200/310 |
| 8,350,280 B2 * | 1/2013 | Lai | H01L 33/508 257/100 |
| 2002/0088155 A1 * | 7/2002 | Persson | G09F 13/42 40/542 |
| 2008/0249368 A1 * | 10/2008 | Takei | A61B 1/00009 600/178 |
| 2013/0043499 A1 * | 2/2013 | Ohta | H01L 33/483 257/98 |

* cited by examiner

*Primary Examiner* — Eric Ward
(74) *Attorney, Agent, or Firm* — Muncy, Geissler, Olds & Lowe, P.C.

(57) ABSTRACT

The present invention includes a safety indication structure a high energy invisible light light emitting structure and two potential applying layers. The high energy invisible light light emitting structure includes a high energy invisible light light emitting layer that receives a forward to emit invisible light, and a P-type semiconductor layer and an N-type semiconductor layer respectively disposed at two sides of the high energy invisible light light emitting layer. The two potential applying layers are respectively in contact with the P-type semiconductor layer and the N-type semiconductor layer. The safety indication structure includes a photoluminescent light emitting layer disposed on the high energy invisible light light emitting structure. When the high energy invisible light light emitting structure emits invisible light, the photoluminescent light emitting layer absorbs and converts the invisible light to visible light, which serves as a signal warning for danger to ensure user safety.

9 Claims, 6 Drawing Sheets

HIGH ENERGY INVISIBLE LIGHT LIGHT EMITTING DIODE HAVING SAFETY INDICATION

FIELD OF THE INVENTION

The present invention relates to a high energy invisible light light emitting structure, and particularly to a high energy invisible light light emitting structure having safety indication.

BACKGROUND OF THE INVENTION

FIG. 1 shows a conventional vertical light emitting diode (LED), which includes a sandwich structure formed by a first-type semiconductor layer 1A, an active layer 2A and a second-type semiconductor layer 3A. Below the second-type semiconductor layer 3A, a substrate 4A and a second-type electrode 5A are sequentially formed. A first-type electrode 6A is disposed at a surface of the first-type semiconductor layer 1A. The first-type semiconductor layer 1A and the second-type semiconductor layer 3A are a combination of one and the other of a P-type semiconductor and an N-type semiconductor.

By applying a forward bias between the first-type electrode 6A and the second-type electrode 5A, the first-type semiconductor layer 1A and the second-type semiconductor layer 3A provide electrons and holes, respectively. The electrons and holes are combined in the active layer 2A to perform energy level jump to further generate an excited light having a constant wavelength.

FIG. 2 shows a conventional horizontal LED, which similarly includes a sandwich structure formed by a first-type semiconductor layer 1B, an active layer 2B and a second-type semiconductor layer 3B. The first-type semiconductor layer 1B is formed on a substrate 4A, and a second-type electrode 5B and a first-type electrode 6B are respectively disposed at same sides of the second-type semiconductor layer 3B and the first-type semiconductor layer 1B. By applying a voltage between the first-type electrode 6B and the second-type electrode 5B, electrons and holes are combined in the active layer 2B to generate an excited light.

Referring to FIG. 3, the U.S. Pat. No. 7,223,998, "White, single or multi-color light emitting diodes by recycling guided modes", discloses a photon recycling LED that mainly includes a nitride LED 9. On the nitride LED 9, a non-doped semiconductor layer 9A, a nitride photoluminescent active layer 9B and another non-doped semiconductor layer 9A are sequentially stacked. An electroluminescent light 9C generated by the nitride LED 9 enters the nitride photoluminescent active layer 9B to generate a photoluminescent light 9D having another wavelength. In other words, the presence of the nitride photoluminescent active layer 9B is to generate a photoluminescent light having another wavelength, i.e., lights of multiple colors are allowed to be blended to generate a white light with a preferred color rendering index (CRI).

Any of the vertical LED, the horizontal LED and another type of LED is capable of generating and emitting light having different wavelengths given that an appropriate material is selected as an active layer according to actual requirements. The light generated includes visible light in various colors, and high energy invisible light such as ultraviolet light.

High energy invisible light, such as ultraviolet light, extensively applied in public environment applications, is capable of effectively killing viruses and bacteria or reducing activity levels of viruses and bacteria to prevent massive contagions.

As high energy invisible light cannot be perceived by human eyes, human bodies can be easily exposed to high energy invisible light without knowing. Pathological changes of the skin or eyes may be caused by an excessive accumulated dosage of high energy invisible light, thus endangering lives and health of users.

SUMMARY OF THE INVENTION

Therefore, it is a primary object of the present invention to disclose a high energy invisible light light emitting diode (LED) with a safety indication structure. High energy invisible light generated is converted to visible light to serve as a signal warning for danger and to further ensure user safety.

To achieve the above object, the present invention provides a high energy invisible light LED with safety indication. The high energy invisible light LED with safety indication includes a high energy invisible light light emitting structure, two potential applying layers and a safety indication structure. The high energy invisible light emitting structure includes a high energy invisible light light emitting layer that receives a forward bias to emit invisible light, and a P-type semiconductor layer and an N-type semiconductor layer disposed at two sides of the high energy invisible light light emitting layer. The two potential applying layers are respectively in contact with the P-type semiconductor layer and the N-type semiconductor layer. The safety indication structure includes a photoluminescent light emitting layer that absorbs invisible light to emit visible light, is disposed at a light exiting surface of the high energy invisible light light emitting structure, and is partially hollow to form a three-dimensional structure on the light exiting surface.

Accordingly, when the high energy invisible light light emitting structure (i.e., the high energy invisible light light emitting layer) emits invisible light, the invisible light is absorbed and converted to visible light by the photoluminescent light emitting layer. Further, a three-dimensional structure is formed by the partially hollow safety indication structure on the light exiting surface. Such structure effectively controls and converts a small part of invisible light to visible light. Thus, most of the high energy invisible light can still be preserved for further utilization, while the visible light is utilized as a signal warning for danger to prevent human bodies from being exposed in high energy invisible light and to ensure user safety.

DETAILED DESCRIPTION OF THE PREFERRED EMBODIMENTS

Details and technical description of the present invention are illustrated by the embodiments below. It should be understood that, these embodiments are for illustration purposes and are not to be construed as limitations to the present invention.

Figure 1:
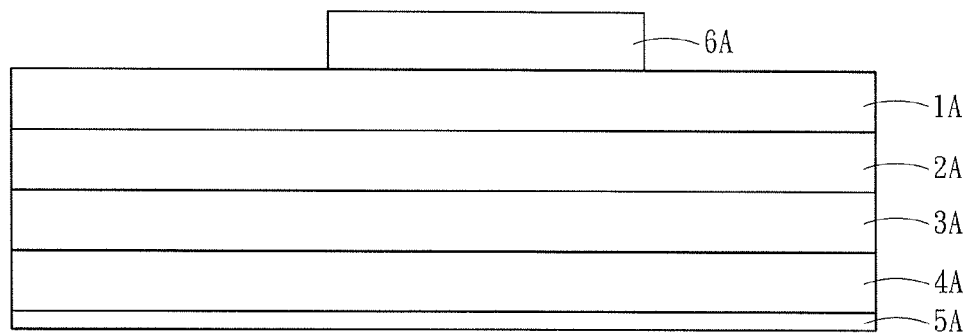
FIG. 1 is a is a structural diagram of a conventional vertical light emitting diode (LED).
Figure 2:
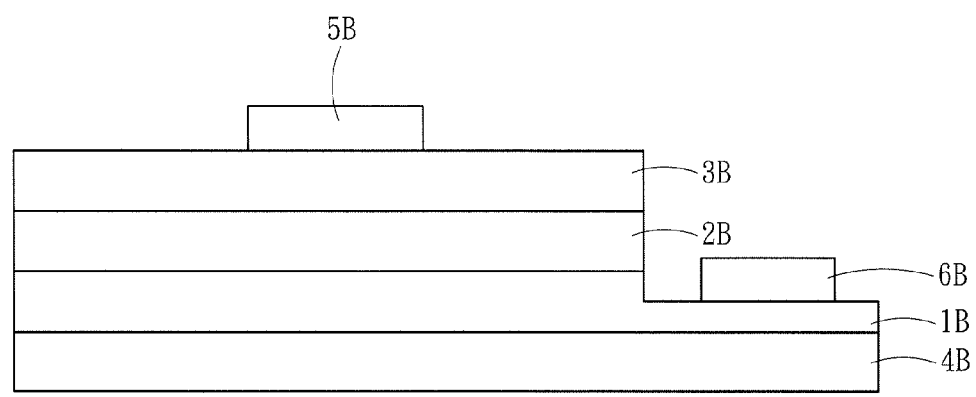
FIG. 2 is a structural diagram of a conventional horizontal LED.
Figure 3:
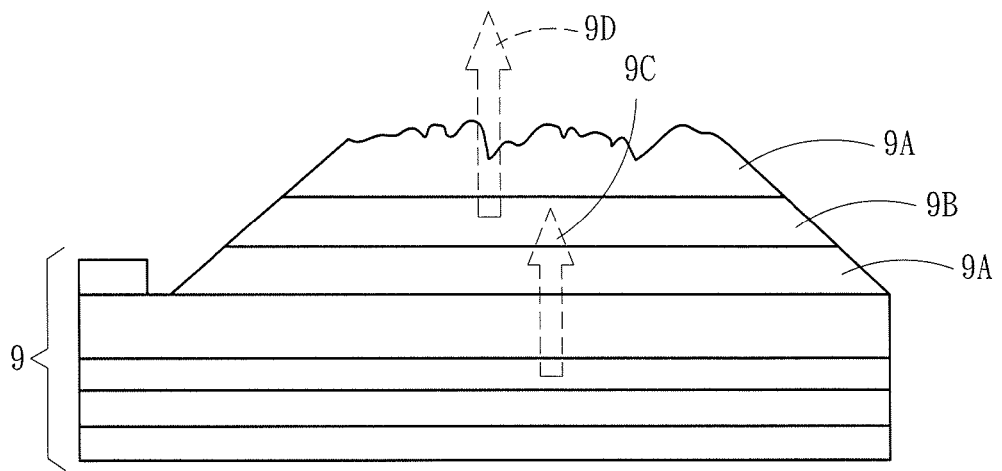
FIG. 3 is a structural diagram of a conventional photoluminescent LED.
Figure 4:
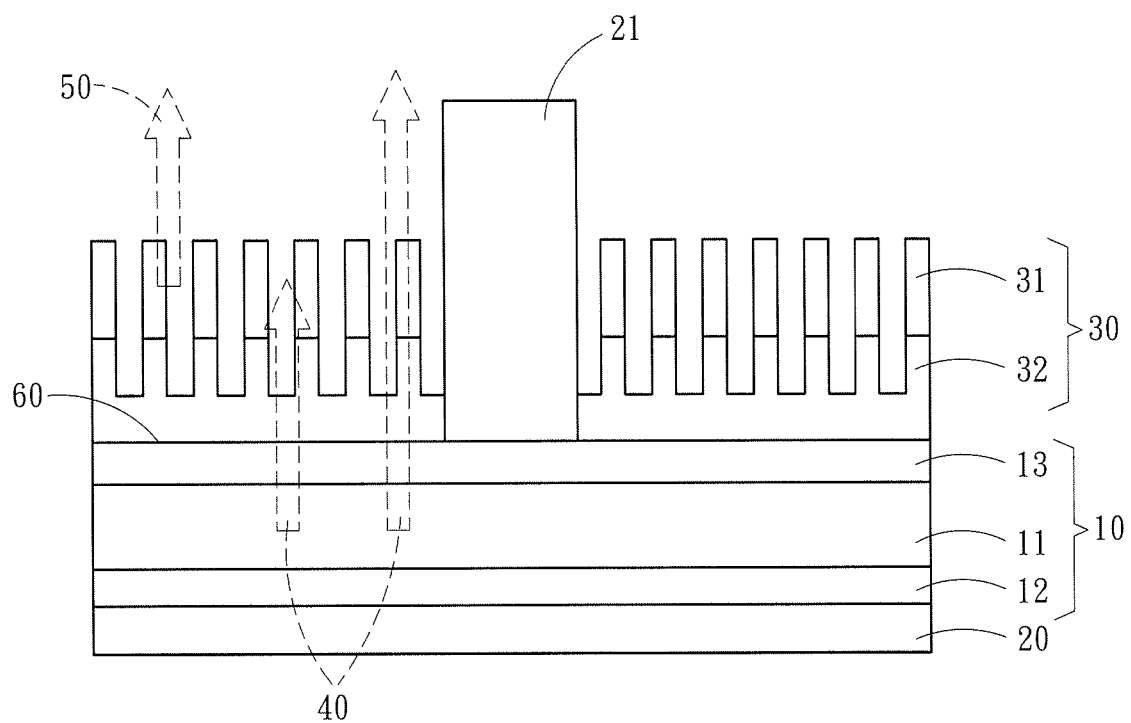
FIG. 4 is a structural diagram of the present invention.
Figure 5:
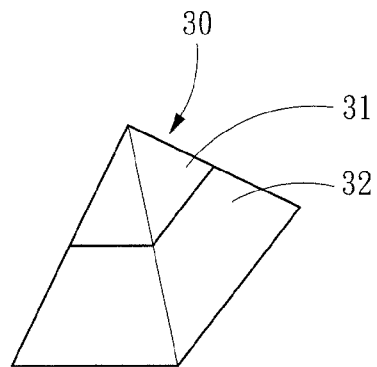
FIG. 5 is a perspective structural diagram of a photoluminescent light emitting layer of the present invention.

Referring to FIG. 4 and FIG. 5, a high energy invisible light light emitting diode (LED) having safety indication includes a high energy invisible light light emitting structure 10, two potential applying layers 20 and 21, and a safety indication structure 30. The high energy invisible light light emitting structure 10 includes a high energy invisible light light emitting layer 11 that receives a forward bias to emit invisible light 40, and a P-type semiconductor layer 12 and an N-type semiconductor layer 13 respectively disposed at two sides of the high energy invisible light light emitting layer 11.

The two potential applying layers 20 and 21 are respectively in contact with the P-type semiconductor layer 12 and the N-type semiconductor layer 13. The safety indication structure 30 includes a photoluminescent light emitting layer 31 that absorbs the invisible light 40 to emit visible light 50. The safety indication structure 30 is disposed on a light exiting surface 60 of the high energy invisible light light emitting structure 10, and is partially hollow to form a three-dimensional structure on the light exiting surface 60. Further, for example, the three-dimensional structure of the safety indication structure 30 may have a horizontal planar contour as selected from one of a circle, a hexagon, a pentagon, a quadrilateral and a triangle. As shown in FIG. 5, a triangular cone is depicted for representation.

In practice, a position of the light exiting surface 60 may be selectively designed at a surface of the P-type semiconductor layer 12 or the N-type semiconductor layer 13. In an embodiment of the present invention, the light exiting surface 60 is disposed on the surface of the N-type semiconductor layer 13. Further, the safety indication structure 30 may further include a semiconductor layer 32 in contact with the N-type semiconductor layer 13. The photoluminescent light emitting layer 31 is disposed on the semiconductor layer 32, which may correspondingly selectively be an N-type semiconductor layer or non-doped semiconductor (U-type semiconductor).

Figure 6:
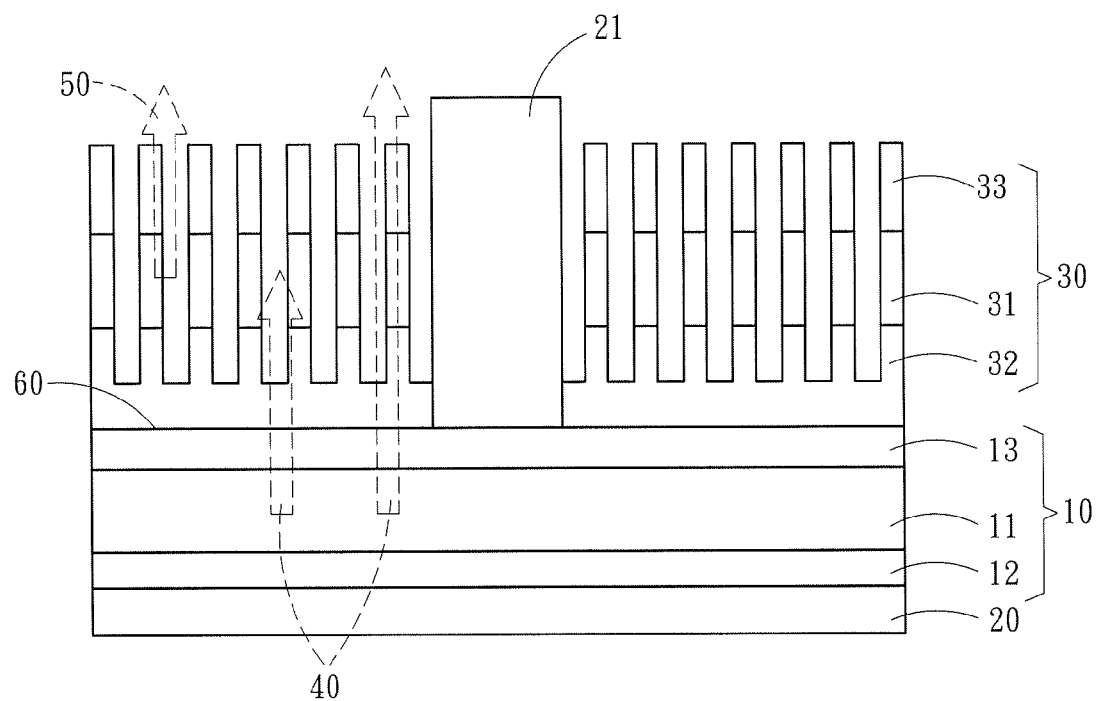
FIG. 6 is a structural diagram according to another embodiment of the present invention.

Referring to FIG. 6 showing another embodiment of the present invention, another semiconductor layer 33 may be further disposed on the photoluminescent light emitting layer 31. The semiconductor layer 33 may be provided with a reflecting or roughened structure to enhance a brightness level.

Figure 7:
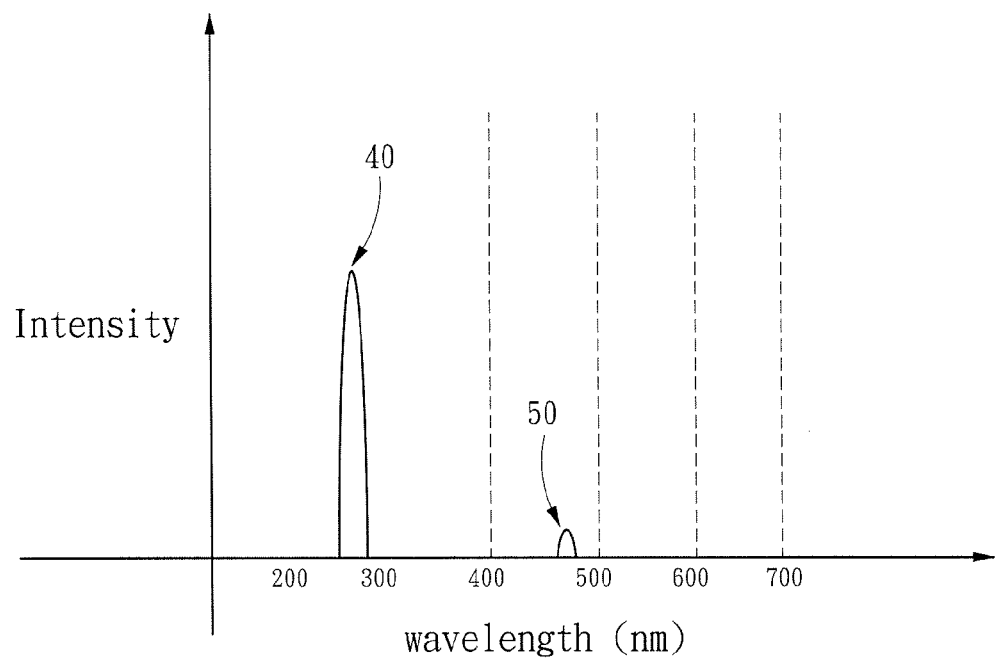
FIG. 7 is a wavelength diagram of absorbed invisible light converted to visible light of the present invention.

Also referring to FIG. 7, when the high energy invisible light light emitting structure 10 (i.e., the high energy invisible light light emitting layer 11) emits the invisible light 40, the photoluminescent light emitting layer 31 of the safety indication structure 30 absorbs the invisible light 40 and converts the invisible light 40 to visible light 50. A light emitting wavelength of the high energy invisible light light emitting layer 11 may be 200 nm to 380 nm (an invisible range), and a light emitting wavelength of the photoluminescent light emitting layer 31 may be 410 nm to 560 nm (a visible range).

A material of the photoluminescent light emitting layer 31 may be a III-V nitride, and may be a non-doped structure or doped with one of magnesium and silicon to enhance light emitting performance. To prevent the photoluminescent light emitting layer 31 from absorbing an excessive amount of the invisible light 40, the thickness of the photoluminescent light emitting layer 31 is preferably limited within 0.1 μm and 2 μm. Alternatively, through selecting the material or the thickness, a part of high energy converted to low energy by the photoluminescent light emitting layer 31 is controlled to be smaller than 30%.

Figure 8:
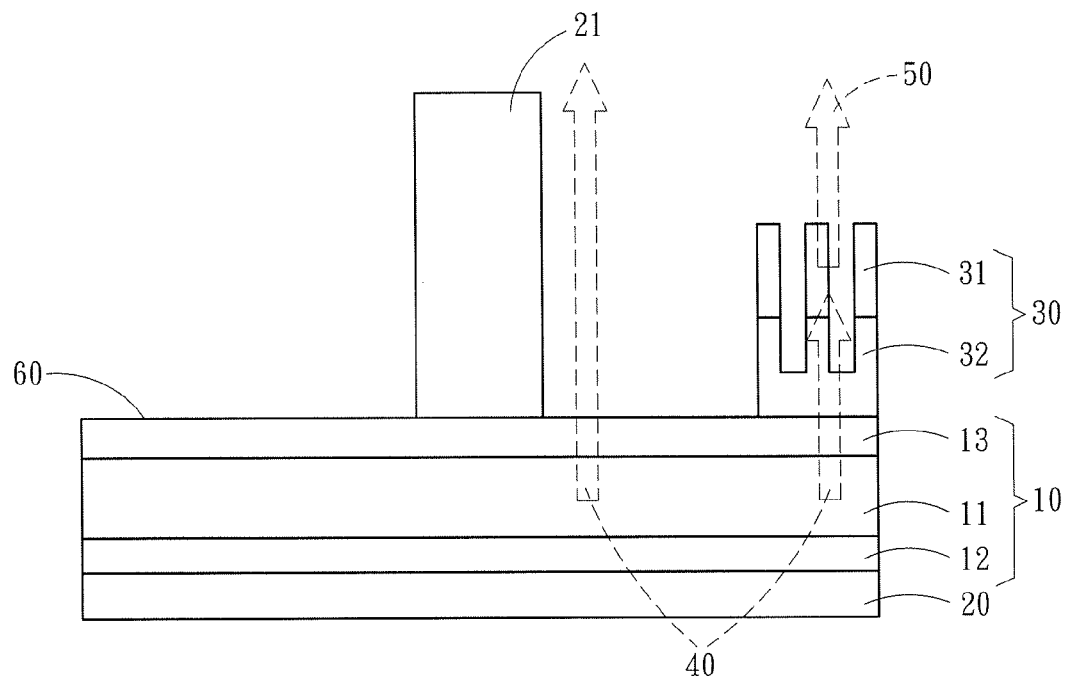
FIG. 8 is a structural diagram according to another embodiment of the present invention.
Figure 9:
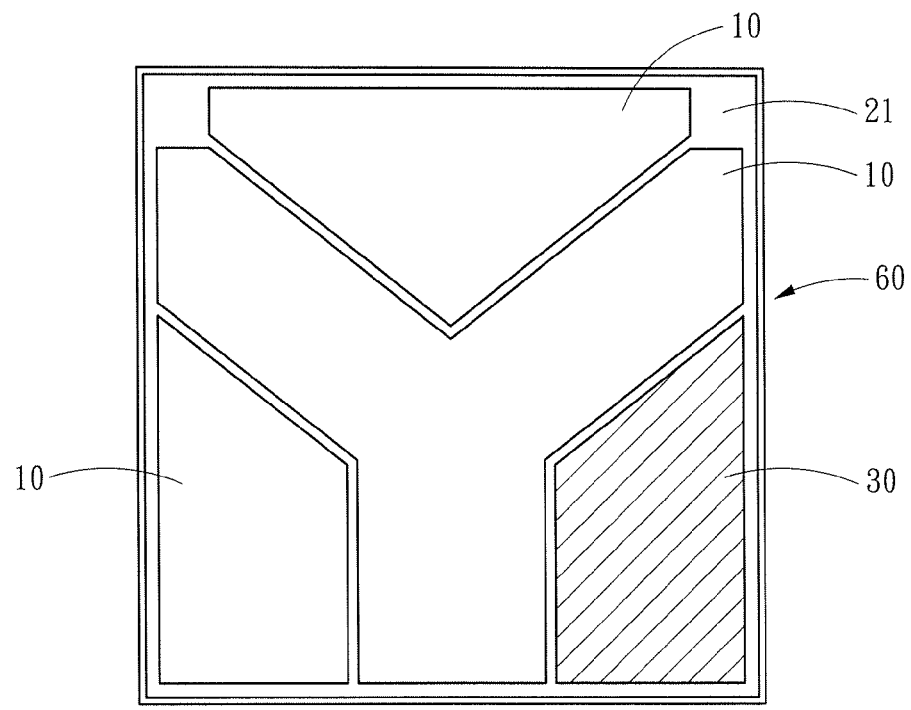
FIG. 9 is a partial view of a safety display of the present invention.
Figure 10:
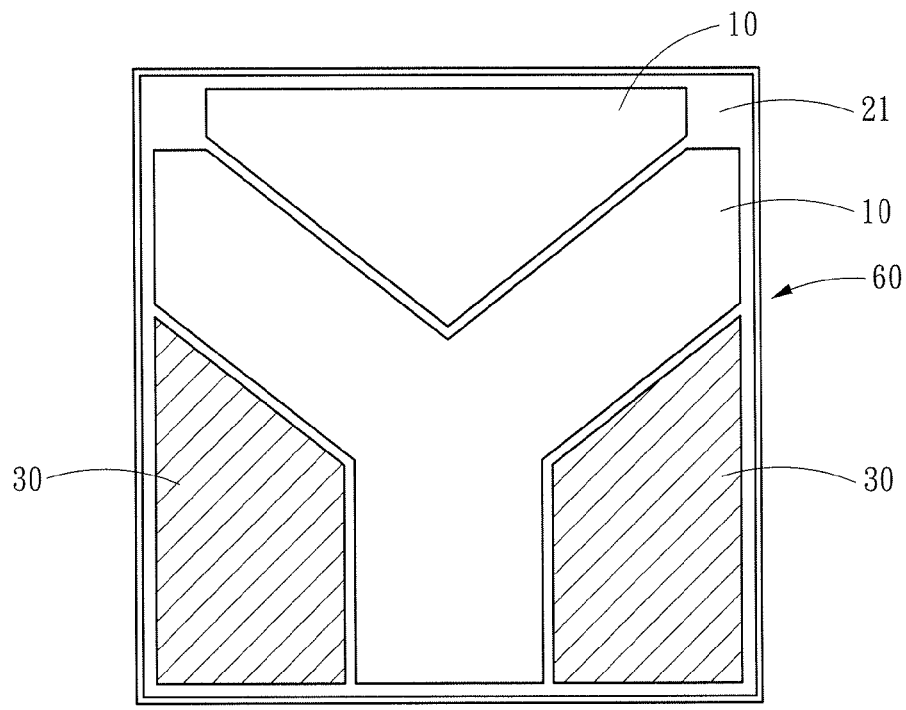
FIG. 10 is a partial view of a safety display of the present invention.

The safety indication structure 30 may be disposed on an entire region of the light exiting surface 60. Alternatively, the safety indication structure 30 may be only disposed at a partial region of the light exiting surface 60, as shown in FIG. 8 and FIG. 9, to a maximum extent, which reduces the amount of the invisible light 40 absorbed and preserves the high energy invisible light 40 for further utilization. Alternatively, as shown in FIG. 10, the safety indication structure 30 may be disposed at two sides of the light exiting surface 60 to increase a brightness level that can be clearly noticed by a user.

Figure 11:
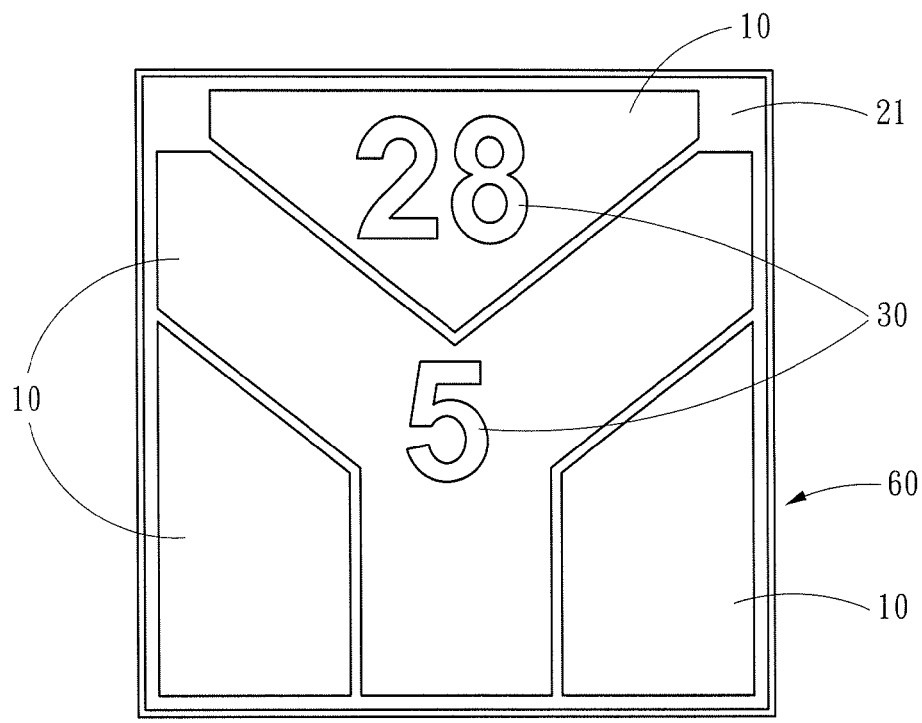
FIG. 11 is a schematic diagram of a numeric safety display of the present invention.
Figure 12:
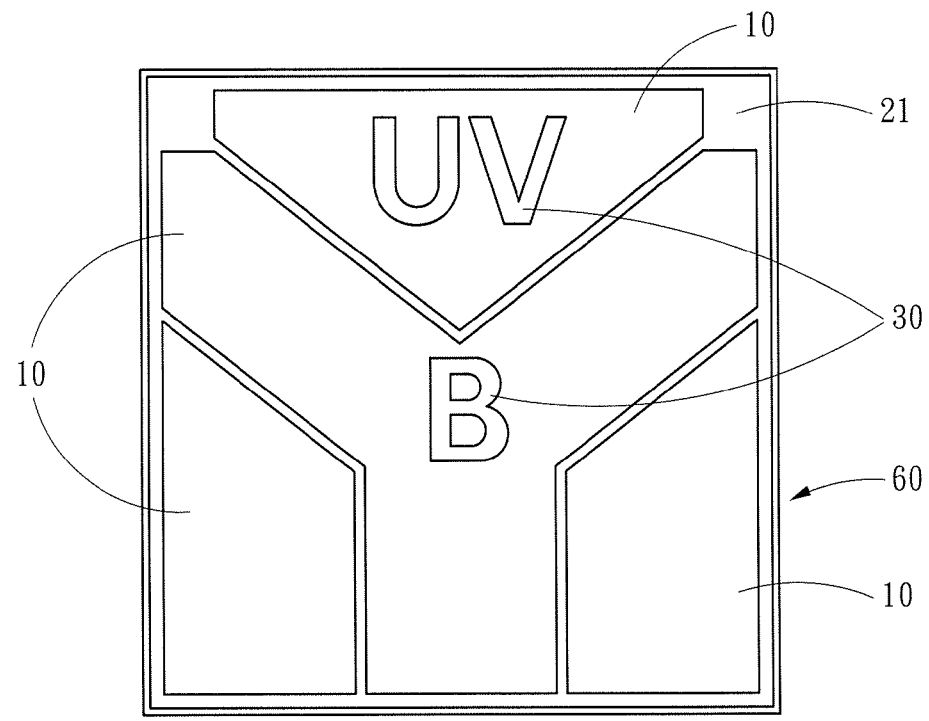
FIG. 12 is a schematic diagram of a text safety display of the present invention.

As shown in FIG. 11 and FIG. 12, the safety indication structure 30 may be disposed on a partial region of the light exiting surface 60, and is indicated along with numbers, text, or text and numbers. For example, the text "UVB" may indicate danger, and the numbers "285" may indicate the corresponding high energy wavelength, so as to specifically indicate the danger and the high energy wavelength to achieve a warning effect.

As described, when the high energy invisible light light emitting structure (i.e., the high energy invisible light light emitting layer) of the present invention emits invisible light, the invisible light is absorbed and converted by the photoluminescent light emitting layer of the safety indication structure to visible light. Further, the photoluminescent light emitting layer of the present invention is partially hollow to form a three-dimensional structure on the light exiting surface. As such, only a very small part of the invisible light is absorbed and converted to visible light, while a large part of the high energy invisible light can be preserved for further utilization. Therefore, the visible light may employed as a signal warning for danger to prevent human bodies from unawarely being exposed in high energy invisible light and to thus ensure user safety.

What is claimed is:

1. A high energy invisible light light emitting diode (LED) having safety indication, comprising:
   a high energy invisible light light emitting structure, sequentially stacking and comprising a P-type semiconductor layer, a high energy invisible light light emitting layer that receives a forward bias to emit invisible light, and an N-type semiconductor layer, the N-type semiconductor layer comprising a light exiting surface away from the high energy invisible light light emitting layer;
   two potential applying layers, respectively being in contact with the P-type semiconductor layer and the N-type semiconductor layer; and
   a safety indication structure, deposed on the high energy invisible light light emitting structure, comprising a semiconductor layer contacting with the light exiting surface directly and a photoluminescent light emitting layer absorbing and converting invisible light to visible light and contacting with the semiconductor layer directly, wherein the photoluminescent light emitting layer comprises a plurality of hollow regions to reveal invisible light directly and forming a three-dimensional structure which is partially hollow on the light exiting surface, wherein the safety indication structure is disposed on a partial region of the light exiting surface, and wherein the safety indication structure is one of numeric, text, and text and numeric representations.

2. The high energy invisible light LED having safety indication of claim 1, wherein a light emitting wavelength of the high energy invisible light light emitting layer is 200 nm to 380 nm.

3. The high energy invisible light LED having safety indication of claim 1, wherein a horizontal planar contour of the three-dimensional structure of the safety indication structure is selected from one of a circle, a hexagon, a pentagon, a quadrilateral cone and a triangle.

4. The high energy invisible light LED having safety indication of claim 1, wherein a light emitting wavelength of the photoluminescent light emitting layer is 410 nm to 560 nm.

5. The high energy invisible light LED having safety indication of claim 1, wherein a material of the photoluminescent light emitting layer is a nitride.

6. The high energy invisible light LED having safety indication of claim 5, wherein the photoluminescent light emitting layer is a non-doped structure or doped with one of magnesium and silicon.

7. The high energy invisible light LED having safety indication of claim 1, wherein a thickness of the photoluminescent light emitting layer is 0.1 μm to 2 μm.

8. The high energy invisible light LED having safety indication of claim 1, wherein a part of high energy converted low energy by the photoluminescent light emitting layer is smaller than 30%.

9. The high energy invisible light LED having safety indication of claim 8, wherein another semiconductor layer is further disposed on the photoluminescent light emitting layer.

* * * * *